(12) United States Patent
Ueno et al.

(10) Patent No.: US 12,369,374 B2
(45) Date of Patent: Jul. 22, 2025

(54) EPITAXIAL GROWTH METHODS AND STRUCTURES THEREOF

(71) Applicant: Taiwan Semiconductor Manufacturing Co., Ltd., Hsinchu (TW)

(72) Inventors: Tetsuji Ueno, Hsinchu (TW); Ming-Hua Yu, Hsinchu (TW); Chan-Lon Yang, Taipei (TW)

(73) Assignee: TAIWAN SEMICODUCTOR MANUFACTURING CO., LTD., Hsinchu (TW)

( * ) Notice: Subject to any disclaimer, the term of this patent is extended or adjusted under 35 U.S.C. 154(b) by 379 days.

(21) Appl. No.: 17/876,244

(22) Filed: Jul. 28, 2022

(65) Prior Publication Data

US 2022/0367639 A1    Nov. 17, 2022

Related U.S. Application Data

(63) Continuation of application No. 15/929,722, filed on May 18, 2020, now Pat. No. 11,456,360, which is a (Continued)

(51) Int. Cl.
*H01L 21/02* (2006.01)
*C23C 16/02* (2006.01)
(Continued)

(52) U.S. Cl.
CPC ....... *H10D 62/834* (2025.01); *C23C 16/0218* (2013.01); *C23C 16/4408* (2013.01); (Continued)

(58) Field of Classification Search
CPC ......... H01L 21/02658; H01L 21/02532; H01L 21/0262; H10D 62/834; H10D 30/024; H10D 30/62
See application file for complete search history.

(56) References Cited

U.S. PATENT DOCUMENTS 5,880,031 A * 3/1999 Wong ................ H01L 21/02049
                                                          438/906
7,144,829 B2  12/2006 Yoneda
(Continued)

FOREIGN PATENT DOCUMENTS

| CN | 102899636 A | 1/2013 |
| TW | 200501237 A | 1/2005 |
| TW | 200504937 A | 2/2005 |

OTHER PUBLICATIONS

Roozeboon, Fred, Rapid Thermal Chemical Vapour Deposition of Epitaxial Si and SiGe Low Temperature Epitaxy in Production, Advances in Rapid Thermal and Integrated Processing, Ch. 16, (n.d.), pp. 443-467, W.B. De Boer, Phillips Research Laboratories, Kluwer Academics Publishers.
(Continued)

*Primary Examiner* — Mounir S Amer
*Assistant Examiner* — Alexander Belousov
(74) *Attorney, Agent, or Firm* — Haynes and Boone, LLP

(57) ABSTRACT

A method and structure for providing a two-step defect reduction bake, followed by a high-temperature epitaxial layer growth. In various embodiments, a semiconductor wafer is loaded into a processing chamber. While the semiconductor wafer is loaded within the processing chamber, a first pre-epitaxial layer deposition baking process is performed at a first pressure and first temperature. In some cases, after the first pre-epitaxial layer deposition baking process, a second pre-epitaxial layer deposition baking process is then performed at a second pressure and second temperature. In some embodiments, the second pressure is different than the first pressure. By way of example, after the second pre-epitaxial layer deposition baking process and while at a growth temperature, a precursor gas may then be
(Continued)

introduced into the processing chamber to deposit an epitaxial layer over the semiconductor wafer.

20 Claims, 11 Drawing Sheets

Related U.S. Application Data continuation of application No. 16/206,500, filed on Nov. 30, 2018, now Pat. No. 10,658,468, which is a continuation of application No. 15/089,153, filed on Apr. 1, 2016, now Pat. No. 10,453,925.

(60) Provisional application No. 62/289,102, filed on Jan. 29, 2016.

(51) Int. Cl.
| | | |
|---|---|---|
| C23C 16/44 | (2006.01) | |
| C30B 25/18 | (2006.01) | |
| C30B 29/06 | (2006.01) | |
| H10D 30/01 | (2025.01) | |
| H10D 62/834 | (2025.01) | |
| H10D 30/62 | (2025.01) | |
| H10D 30/67 | (2025.01) | |
| H10D 30/69 | (2025.01) | |
| H10D 84/01 | (2025.01) | |
| H10D 84/03 | (2025.01) | |

(52) U.S. Cl.
CPC ............ *C30B 25/186* (2013.01); *C30B 29/06* (2013.01); *H01L 21/02532* (2013.01); *H01L 21/0262* (2013.01); *H01L 21/02661* (2013.01); *H10D 30/024* (2025.01); *H10D 30/0323* (2025.01); *H01L 21/02576* (2013.01); *H01L 21/02579* (2013.01); *H10D 30/027* (2025.01); *H10D 30/62* (2025.01); *H10D 30/6735* (2025.01); *H10D 30/797* (2025.01); *H10D 84/0158* (2025.01); *H10D 84/038* (2025.01)

(56) References Cited

U.S. PATENT DOCUMENTS

| | | |
|---|---|---|
| 7,425,740 B2 | 9/2008 | Liu et al. |
| 7,910,996 B2 | 3/2011 | Besser et al. |
| 8,048,723 B2 | 11/2011 | Chang et al. |
| 8,053,299 B2 | 11/2011 | Xu |
| 8,097,527 B2 | 1/2012 | Yang et al. |
| 8,183,627 B2 | 5/2012 | Currie |
| 8,415,718 B2 | 4/2013 | Xu |
| 8,497,177 B1 | 7/2013 | Chang et al. |
| 8,591,752 B2 | 11/2013 | Abe et al. |
| 8,609,518 B2 | 12/2013 | Wann et al. |
| 8,618,556 B2 | 12/2013 | Wu et al. |
| 8,633,516 B1 | 1/2014 | Wu et al. |
| 8,703,565 B2 | 4/2014 | Chang et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,815,712 B2 | 8/2014 | Wan et al. |
| 8,969,190 B2 | 3/2015 | Kronholz et al. |
| 9,570,316 B2 | 2/2017 | Lee et al. |
| 2005/0130434 A1* | 6/2005 | Chien ................ H10D 30/0227 257/E21.431 |
| 2005/0148161 A1 | 7/2005 | Chen et al. |
| 2005/0148162 A1 | 7/2005 | Chen et al. |
| 2009/0017603 A1* | 1/2009 | Yang ................... H01L 21/0206 438/503 |
| 2009/0267152 A1* | 10/2009 | Besser ............... H10D 30/0323 257/E21.415 |
| 2010/0006024 A1 | 1/2010 | Brabant et al. |
| 2013/0285153 A1 | 10/2013 | Lee et al. |
| 2014/0083453 A1 | 3/2014 | Yin et al. |
| 2014/0183600 A1 | 7/2014 | Huang et al. |
| 2014/0264590 A1 | 9/2014 | Yu et al. |
| 2014/0264592 A1 | 9/2014 | Oxland et al. |
| 2015/0263003 A1 | 9/2015 | Lee et al. |
| 2015/0340281 A1* | 11/2015 | Lee ................... H01L 21/76895 438/618 |
| 2016/0079062 A1* | 3/2016 | Zheng ................... C23C 16/481 438/498 |
| 2017/0207069 A1 | 7/2017 | Bhatia et al. |
| 2017/0287588 A1 | 10/2017 | Di-Gianni |
| 2022/0367639 A1* | 11/2022 | Ueno ................... H10D 62/834 |

OTHER PUBLICATIONS

Greve, D.W., UHV/CVD and related growth techniques for Si and other materials, (n.d.), 20 pps., Department of Electrical and Computer Engineering, Carnegie Mellon University, Pittsburgh, PA; URL:http://ww.ece.cmu.edu/~dwg.

* cited by examiner

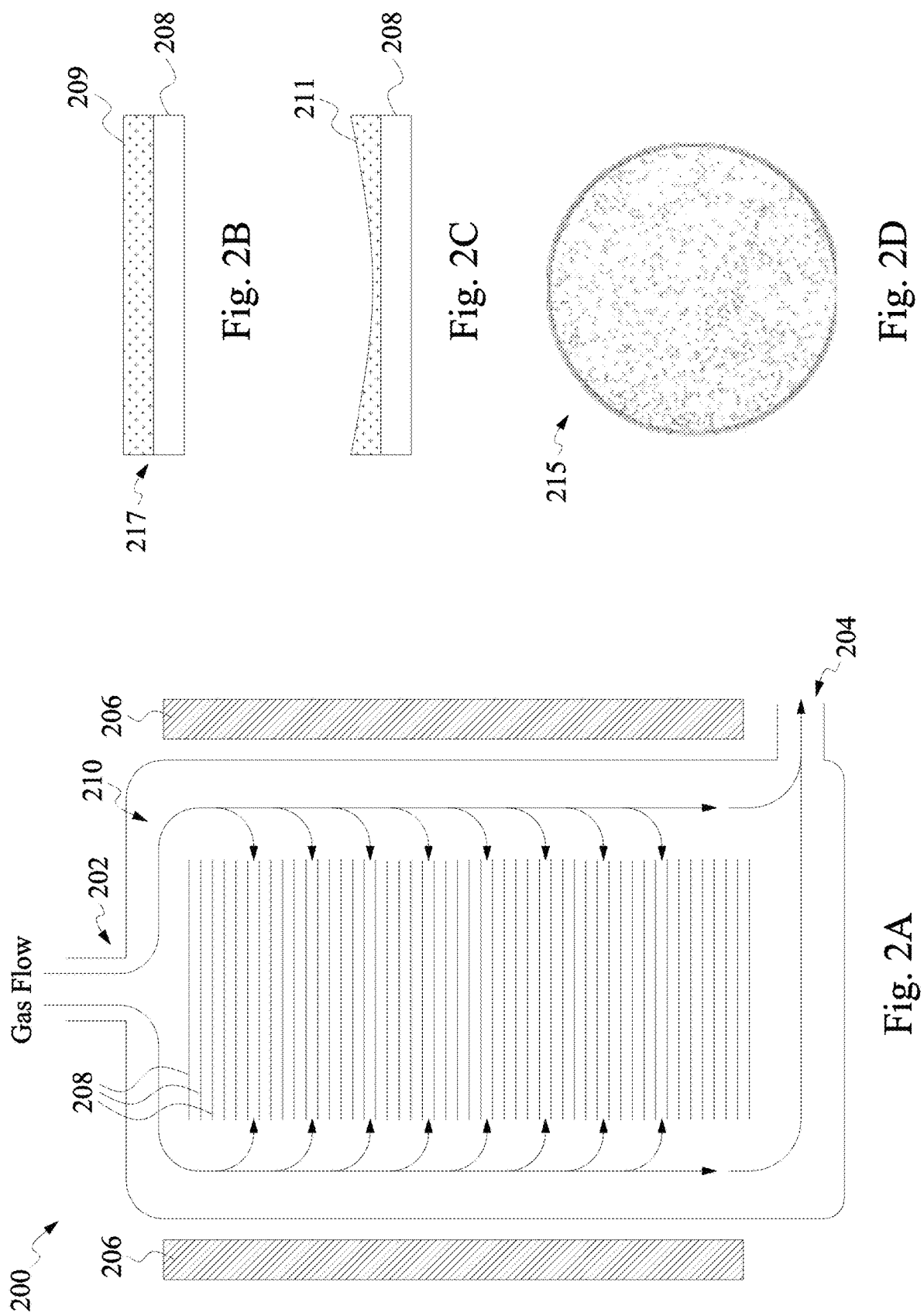

Process C:
1000Pa for 1hr @800C
20Pa for 1hr @800C

Number of Defects: 18ea

Defects # by Type:
Concave: 6/18ea
Hump: 2/18ea
Fall-on: 10/18ea

Process B:
20Pa for 1hr @800C
1000Pa for 1hr @800C

Number of Defects: 178ea

Defects # by Type:
Concave: 142/178ea
Hump: 21/178ea
Fall-on: 15/178ea

Process A:
1000Pa for 2hrs @800C

Number of Defects: 791ea

Defects # by Type:
Concave: 700/791ea
Hump: 76/791ea
Fall-on: 15/791ea

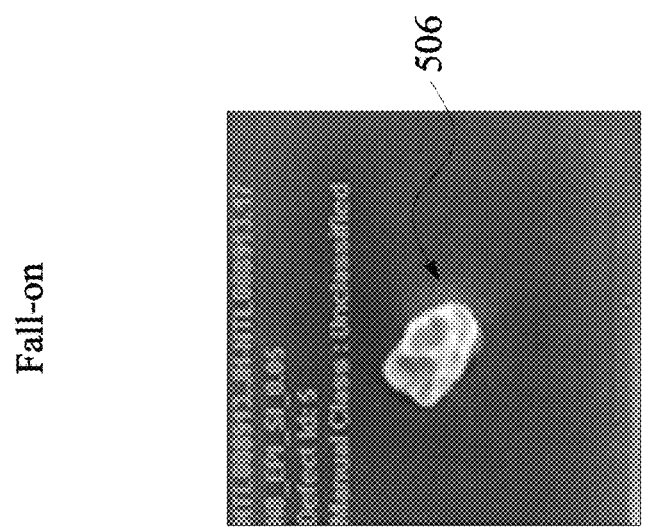
Fig. 5C Fall-on
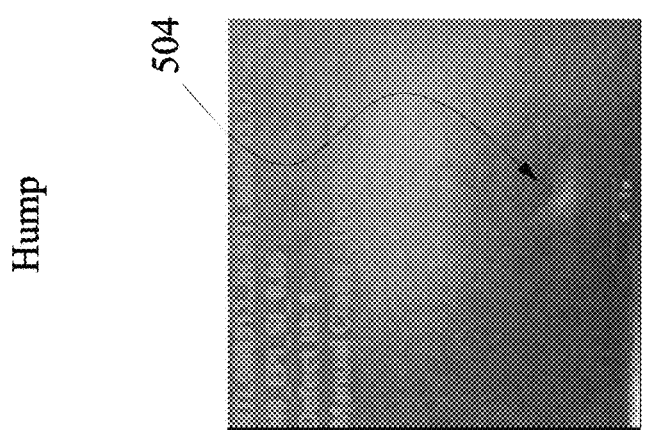
Fig. 5B Hump
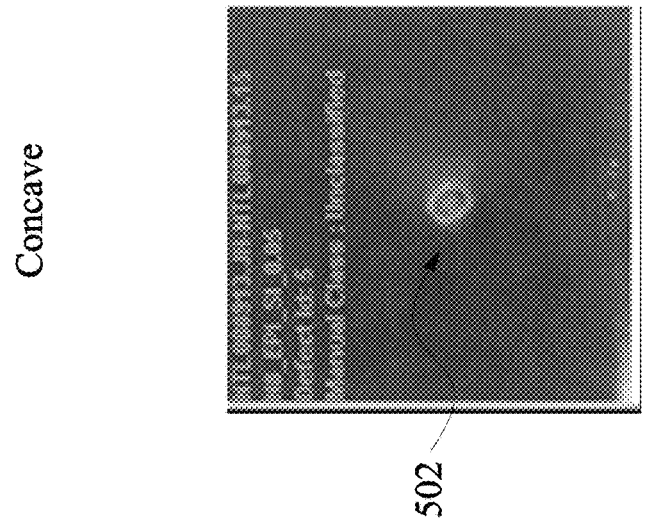
Fig. 5A Concave

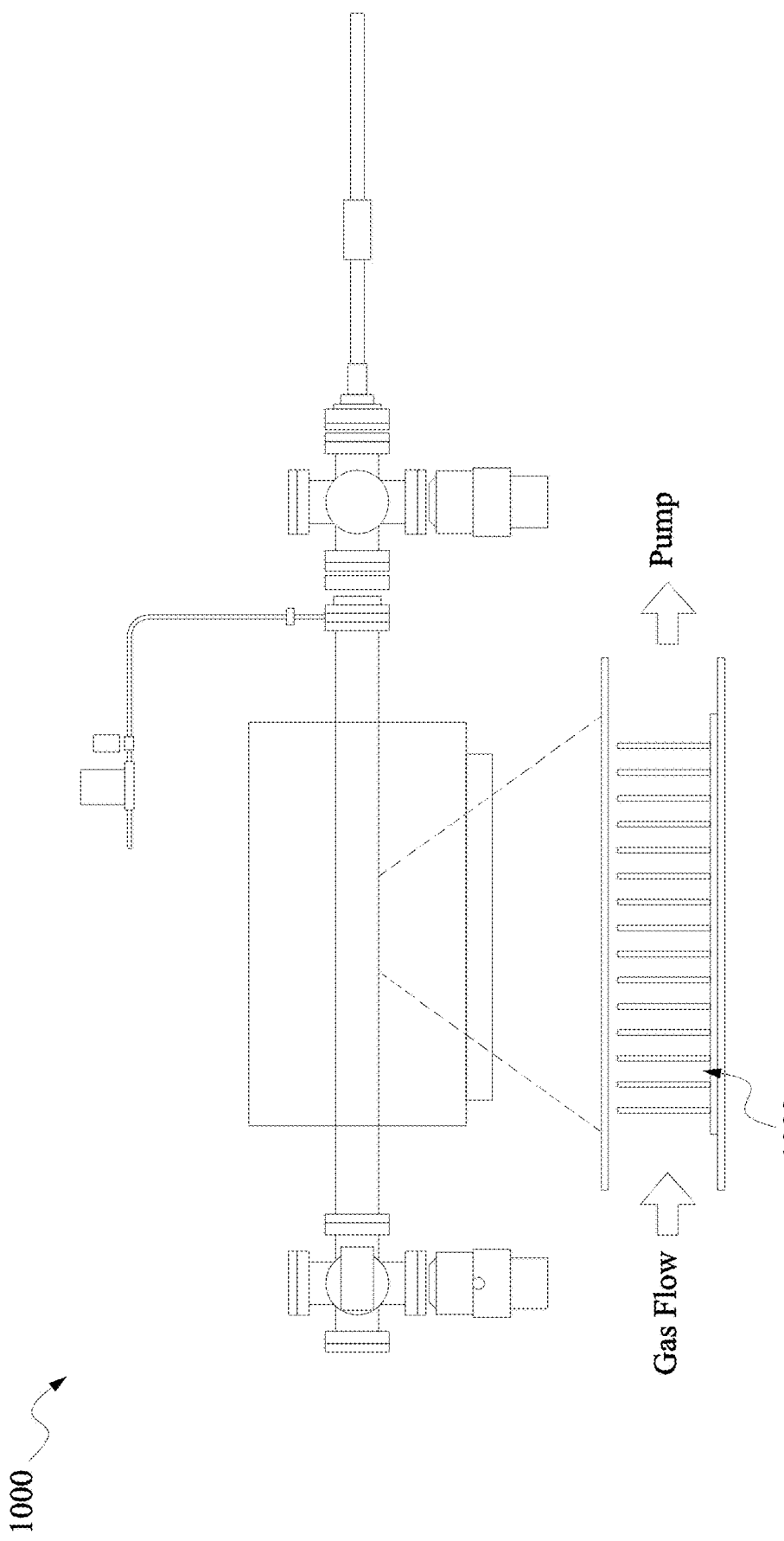

EPITAXIAL GROWTH METHODS AND STRUCTURES THEREOF

CROSS-REFERENCE TO RELATED APPLICATIONS

This application is a continuation of U.S. patent application Ser. No. 15/929,722, filed May 18, 2020, which is a continuation of U.S. patent application Ser. No. 16/206,500, filed Nov. 30, 2018, now U.S. Pat. No. 10,658,468, which is a continuation of U.S. patent application Ser. No. 15/089,153, filed Apr. 1, 2016, now U.S. Pat. No. 10,453,925, which claims the benefit of U.S. Provisional Application No. 62/289,102, filed Jan. 29, 2016, the disclosures of which are herein incorporated by reference in their entirety.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

For example, while prior semiconductor technology generations may have been relatively more tolerant of defects and/or other wafer non-uniformities, the continued scaling of ICs has put more stringent constraints on the quantity and size of defects, as well as on wafer uniformity, that is acceptable for high-quality material layers and devices. In various examples, epitaxial layer growth has been used to form a variety of material layers useful for the fabrication of a semiconductor device. However, in at least some existing processes, a number and/or size of epitaxial layer defects (e.g., formed during epitaxial layer growth) remaining after epitaxial layer growth may not be well-suited for the fabrication of advanced semiconductor devices and circuits. In some cases, non-uniformity of epitaxially-grown layers may also be problematic for device and/or circuit fabrication.

Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

FIG. 2A illustrates a CVD reactor useful for implementing one or more aspects of the present disclosure;

FIG. 2B illustrates a semiconductor wafer processed according to a first set of processing conditions in the CVD reactor of FIG. 2A;

FIG. 2C illustrates a semiconductor wafer processed according to a second set of processing conditions in the CVD reactor of FIG. 2A;

FIG. 2D illustrates a particle defect map of a semiconductor wafer processed according to a third set of processing conditions in the CVD reactor of FIG. 2A;

FIGS. 5A, 5B, and 5C illustrate examples of a concave-type defect, a hump-type defect, and a fall-on-type defect, respectively, and in accordance with some embodiments;

FIG. 10 illustrates a schematic diagram of a multi-wafer UHV/CVD system including a horizontal reactor, useful for implementing one or more aspects of the present disclosure.

DETAILED DESCRIPTION

Figure 1A:
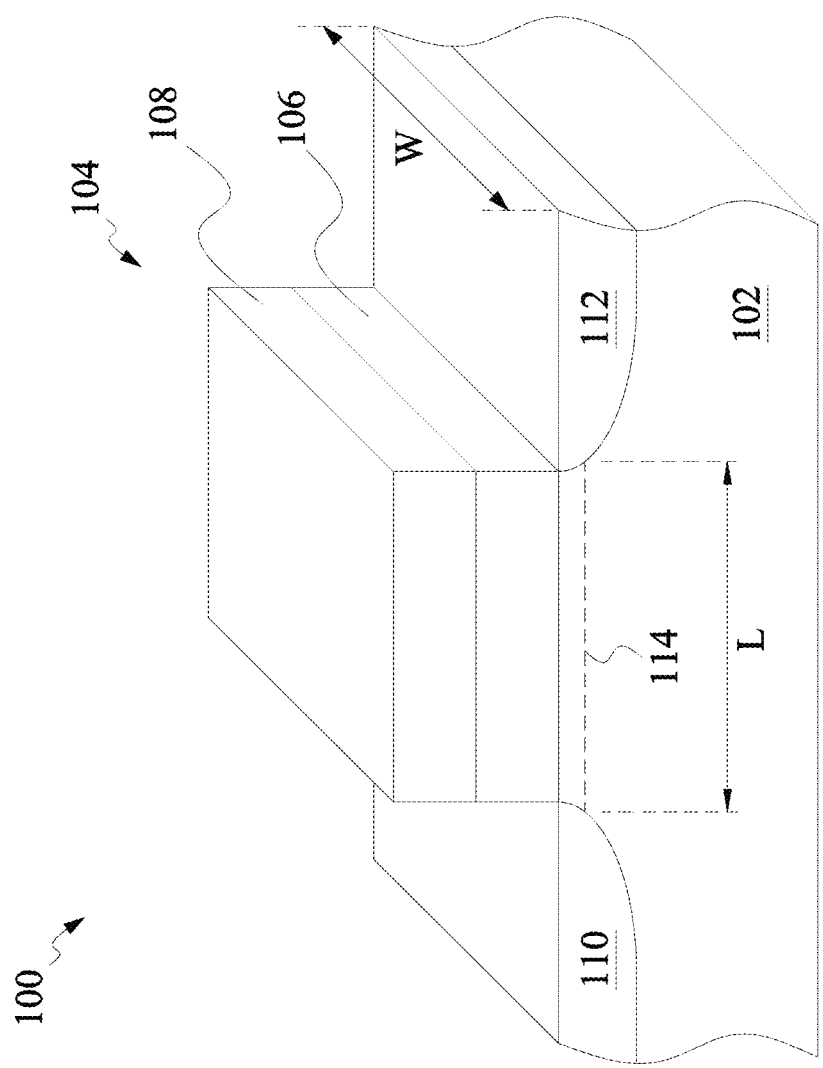
FIG. 1A is a cross-sectional view of an MOS transistor according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of methods of epitaxial layer formation, which may be employed in any of a variety of device types. For example, embodiments of the present disclosure may be used to form epitaxial layers suitable for use in planar bulk metal-oxide-semiconductor field-effect transistors (MOSFETs), multi-gate transistors (planar or vertical) such as FinFET devices, gate-all-around (GAA) devices, Omega-gate (Ω-gate) devices, or Pi-gate (Π-gate) devices, as well as strained-semiconductor devices, silicon-on-insulator (SOI) devices, partially-depleted SOI devices, fully-depleted SOI devices, or other devices as known in the art. In addition, embodiments disclosed herein may be employed in the formation of P-type and/or N-type devices. One of ordinary skill may recognize other embodiments of semiconductor devices that may benefit from aspects of the present disclosure. For example, some embodiments as described herein may also be applied to the formation of contacts, vias, or interconnects.

With reference to the example of FIG. 1A, illustrated therein is an MOS transistor 100, providing an example of merely one device type which may include embodiments of the present disclosure. It is understood that the exemplary transistor 100 is not meant to be limiting in any way, and those of skill in the art will recognize that embodiments of the present disclosure may be equally applicable to any of a variety of other device types, such as those described above. The transistor 100 is fabricated on a substrate 102 and includes a gate stack 104. The substrate 102 may be a semiconductor substrate such as a silicon substrate. The substrate 102 may include various layers, including conductive or insulating layers formed on the substrate 102. The substrate 102 may include various doping configurations depending on design requirements as is known in the art. The substrate 102 may also include other semiconductors such as germanium, silicon carbide (SiC), silicon germanium (SiGe), or diamond. Alternatively, the substrate 102 may include a compound semiconductor and/or an alloy semiconductor. Further, in some embodiments, the substrate 102 may include an epitaxial layer (epi-layer), the substrate 102 may be strained for performance enhancement, the substrate 102 may include a silicon-on-insulator (SOI) structure, and/or the substrate 102 may have other suitable enhancement features.

The gate stack 104 includes a gate dielectric 106 and a gate electrode 108 disposed on the gate dielectric 130. In some embodiments, the gate dielectric 106 may include an interfacial layer such as silicon oxide layer ($SiO_2$) or silicon oxynitride (SiON), where such interfacial layer may be formed by chemical oxidation, thermal oxidation, atomic layer deposition (ALD), chemical vapor deposition (CVD), and/or other suitable method. In some examples, the gate dielectric 106 includes a high-k dielectric layer such as hafnium oxide ($HfO_2$). Alternatively, the high-k dielectric layer may include other high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. High-K gate dielectrics, as used and described herein, include dielectric materials having a high dielectric constant, for example, greater than that of thermal silicon oxide (~3.9). In still other embodiments, the gate dielectric 106 may include silicon dioxide or other suitable dielectric. The gate dielectric 106 may be formed by ALD, physical vapor deposition (PVD), oxidation, and/or other suitable methods. In some embodiments, the gate electrode 108 may be deposited as part of a gate first or gate last (e.g., replacement gate) process. In various embodiments, the gate electrode 108 includes a conductive layer such as W, TiN, TaN, WN, Re, Ir, Ru, Mo, Al, Cu, Co, Ni, combinations thereof, and/or other suitable compositions. In some examples, the gate electrode 108 may include a first metal material for an N-type transistor and a second metal material for a P-type transistor. Thus, the transistor 100 may include a dual work-function metal gate configuration. For example, the first metal material (e.g., for N-type devices) may include metals having a work function substantially aligned with a work function of the substrate conduction band, or at least substantially aligned with a work function of the conduction band of a channel region 114 of the transistor 100. Similarly, the second metal material (e.g., for P-type devices) may include metals having a work function substantially aligned with a work function of the substrate valence band, or at least substantially aligned with a work function of the valence band of the channel region 114 of the transistor 100. Thus, the gate electrode 104 may provide a gate electrode for the transistor 100, including both N-type and P-type devices. In some embodiments, the gate electrode 108 may alternately or additionally include a polysilicon layer. In various examples, the gate electrode 108 may be formed using PVD, CVD, electron beam (e-beam) evaporation, and/or other suitable process. In some embodiments, sidewall spacers are formed on sidewalls of the gate stack 104. Such sidewall spacers may include a dielectric material such as silicon oxide, silicon nitride, silicon carbide, silicon oxynitride, or combinations thereof.

The transistor 100 further includes a source region 110 and a drain region 112 each formed within the semiconductor substrate 102, adjacent to and on either side of the gate stack 104. In some embodiments, the source and drain regions 110, 112 include diffused source/drain regions, ion implanted source/drain regions, epitaxially grown regions, or a combination thereof. The channel region 114 of the transistor 100 is defined as the region between the source and drain regions 110, 112 under the gate dielectric 106, and within the semiconductor substrate 102. The channel region 114 has an associated channel length "L" and an associated channel width "W". When a bias voltage greater than a threshold voltage ($V_t$) (i.e., turn-on voltage) for the transistor 100 is applied to the gate electrode 108 along with a concurrently applied bias voltage between the source and drain regions 110, 112, an electric current (e.g., a transistor drive current) flows between the source and drain regions 110, 112 through the channel region 114. The amount of drive current developed for a given bias voltage (e.g., applied to the gate electrode 108 or between the source and drain regions 110, 112) is a function of, among others, the mobility of the material used to form the channel region 114. In some examples, the channel region 114 includes silicon (Si) and/or a high-mobility material such as germanium, which may be epitaxially grown, as well as any of the plurality of compound semiconductors or alloy semiconductors as known in the art. High-mobility materials include those materials with electron and/or hole mobility greater than silicon (Si), which has an intrinsic electron mobility at room temperature (300 K) of around 1350 $cm^2$/V-s and a hole mobility of around 480 $cm^2$/V-s.

Figure 1B:
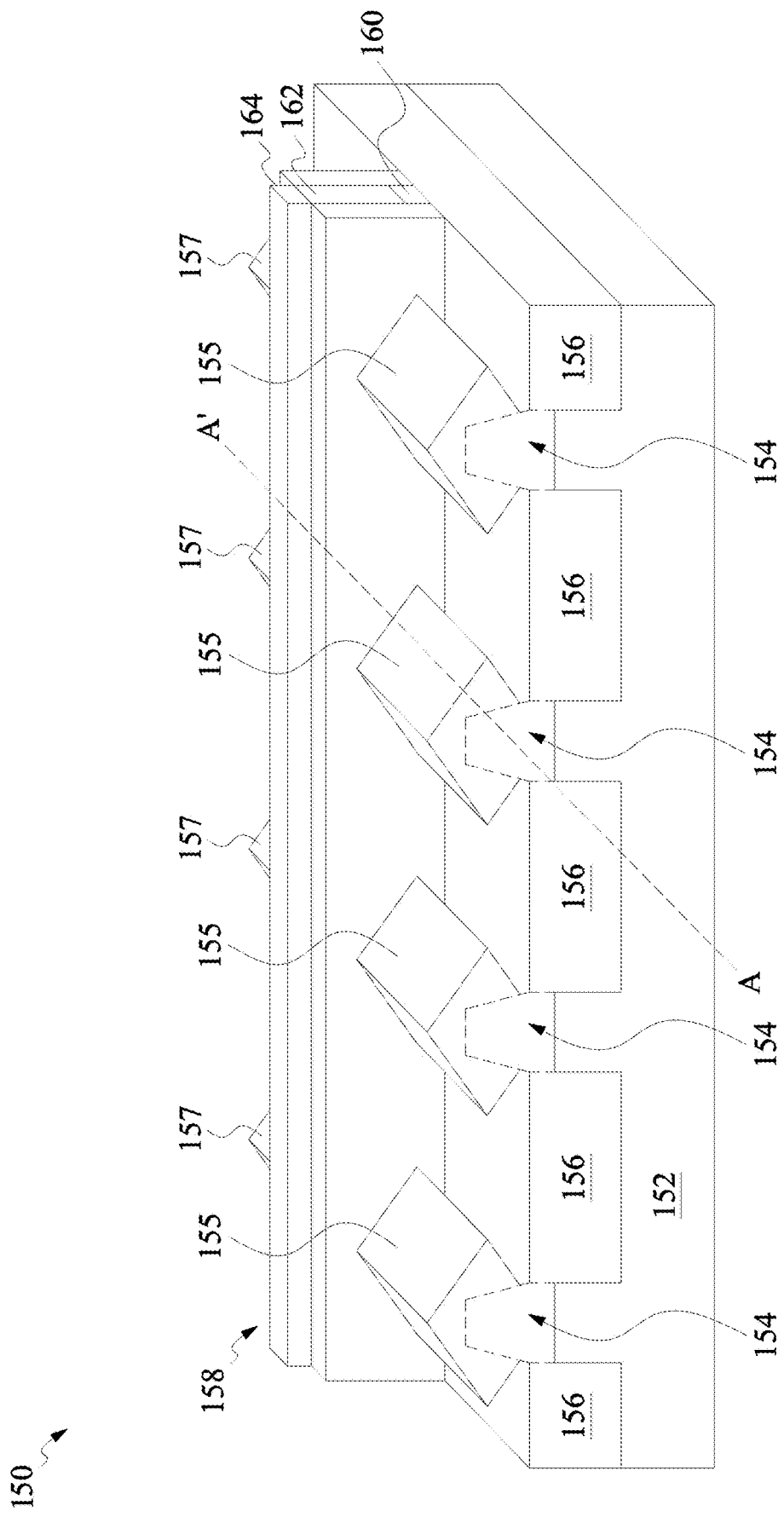
FIG. 1B is perspective view of an embodiment of a FinFET device according to one or more aspects of the present disclosure.

Referring to FIG. 1B, illustrated therein is a FinFET device 150, providing an example of an alternative device type which may include embodiments of the present disclosure. By way of example, the FinFET device 100 includes one or more fin-based, multi-gate field-effect transistors (FETs). The FinFET device 100 includes a substrate 152, at least one fin element 154 extending from the substrate 152, isolation regions 156, and a gate structure 158 disposed on and around the fin-element 154. The substrate 152 may be a semiconductor substrate such as a silicon substrate. In various embodiments, the substrate 152 may be substantially the same as the substrate 102, as described above.

The fin-element 154, like the substrate 152, may include one or more epitaxially-grown layers, and may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 154 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the making element may be performed using an electron beam (e-beam) lithography process. The masking element may then be used to protect regions of the substrate while an etch process forms recesses into the silicon layer, thereby leaving an extending fin 154. The recesses may be etched using a dry etch (e.g., chemical oxide removal), a wet etch, and/or other suitable processes. Numerous other embodiments of methods to form the fins 154 on the substrate 152 may also be used.

Each of the plurality of fins 154 also include a source region 155 and a drain region 157 where the source/drain regions 155, 157 are formed in, on, and/or surrounding the fin 154. The source/drain regions 155, 157 may be epitaxially grown over the fins 154. In addition, a channel region of a transistor is disposed within the fin 154, underlying the gate structure 158, along a plane substantially parallel to a plane defined by section AA' of FIG. 1B. In some examples, the channel region of the fin includes a high-mobility material, as described above.

The isolation regions 156 may be shallow trench isolation (STI) features. Alternatively, a field oxide, a LOCOS feature, and/or other suitable isolation features may be implemented on and/or within the substrate 152. The isolation regions 156 may be composed of silicon oxide, silicon nitride, silicon oxynitride, fluorine-doped silicate glass (FSG), a low-k dielectric, combinations thereof, and/or other suitable material known in the art. In an embodiment, the isolation structures are STI features and are formed by etching trenches in the substrate 152. The trenches may then be filled with isolating material, followed by a chemical mechanical polishing (CMP) process. However, other embodiments are possible. In some embodiments, the isolation regions 156 may include a multi-layer structure, for example, having one or more liner layers.

The gate structure 158 includes a gate stack having an interfacial layer 160 formed over the channel region of the fin 154, a gate dielectric layer 162 formed over the interfacial layer 160, and a metal layer 164 formed over the gate dielectric layer 162. In various embodiments, the interfacial layer 160 is substantially the same as the interfacial layer described as part of the gate dielectric 106. In some embodiments, the gate dielectric layer 162 is substantially the same as the gate dielectric 106 and may include high-k dielectrics similar to that used for the gate dielectric 106. Similarly, in various embodiments, the metal layer 164 is substantially the same as the gate electrode 108, described above. In some embodiments, sidewall spacers are formed on sidewalls of the gate structure 158. The sidewall spacers may include a dielectric material such as silicon oxide, silicon nitride, silicon carbide, silicon oxynitride, or combinations thereof.

As discussed above, each of the transistor 100 and FinFET device 150 may include one or more epitaxially-grown layers. In general, epitaxial layer growth is attractive for its potential to provide high purity layers with low defect density, abrupt interfaces, controlled doping profiles, and high repeatability and uniformity, among others. However, at least some existing epitaxial growth processes have not proved satisfactory in all respects. For example, at least some existing processes (e.g., with larger IC dimensions) have been able to tolerate larger-sized defects, and thus in at least some cases such processes have not been largely affected by epitaxial layer defects (e.g., formed during epitaxial layer growth) smaller than a certain size (e.g., smaller than 100 nanometers). With the aggressive scaling and ever-increasing complexity of advanced IC devices and circuits however, defect mitigation has become more urgent.

By way of example, and with reference to FIG. 2A, consider a CVD reactor 200, which may include a gas injection port 202, a gas exhaust port 204, heating elements 206, and a plurality of semiconductor wafers 208 (e.g., loaded onto a wafer holder) disposed within a processing chamber 210. In the example of FIG. 2A, the CVD reactor 200 includes a vertical reactor, but in some cases, the CVD reactor 200 may include a horizontal reactor. In some embodiments, the CVD reactor 200 may also include a drive unit, for example, to rotate the wafer holder during processing, and the processing chamber 210 may be fluidly coupled to a vacuum/pumping system used to maintain a vacuum condition of the processing chamber 210. In various examples, the vacuum/pumping system may include one or more of a load-lock chamber, a turbomolecular pump, a cryopump, a mechanical pump, or other appropriate vacuum/pumping system elements. Now, consider the examples of FIGS. 2B, 2C, and 2D, which present illustrations of wafers (e.g., semiconductor wafer 208) processed in the CVD reactor 200, according to a variety of different processing conditions. Referring first to FIG. 2B, illustrated therein is a semiconductor wafer 208 having an epitaxial silicon layer 209, grown in the CVD reactor 200, using a silane ($SiH_4$) precursor at a growth temperature of about 500 degrees Celsius (e.g., which represents a typical growth temperature for at least some existing epitaxial growth processes). In various examples, a growth interface 217 is defined as the interface between a substrate (e.g., the semiconductor wafer 208) and an epitaxial layer grown on the substrate (e.g., the epitaxial silicon layer 209), as shown in FIG. 2B. Under such processing conditions, and in some cases, the example of FIG. 2B represents a surface reaction-limited growth process, where the epitaxial silicon layer 209 exhibits good uniformity. As described above, however, there are many problems associated with higher temperature epitaxial layer growth. For example, with reference now to FIG. 2C, illustrated therein is a semiconductor wafer 208 having an epitaxial layer 211, grown in the CVD reactor 200, again using a silane ($SiH_4$) precursor but at a growth temperature greater than about 700 degrees Celsius. Under these processing conditions, and in some cases, the example of FIG. 2C represents a mass transfer-limited growth process, where the epitaxial layer 211 exhibits poor uniformity. As another example and with reference to FIG. 2D, illustrated therein is a particle defect map 215 generated by a wafer defect scanning tool, for example of a semiconductor wafer 208 having an epitaxial layer grown thereon (e.g., in the CVD reactor 200), again using a silane ($SiH_4$) precursor but at a growth temperature of about 750 degrees Celsius and at a pressure of about 100 pascals. The particle defect map 215 of FIG. 2D shows that the wafer has about 1,410 particles of a size about 0.5 microns (1410ea@0.5 um). This data indicates that under the processing conditions represented in the example of FIG. 2D there are significant gas-phase reactions which cause particle deposition onto the semiconductor wafer surface, resulting in the many particles illustrated in the particle defect map 215. Taken collectively, the examples of FIGS. 2A-2D are meant to illustrate at least some mechanisms that result in high/good within-wafer uniformity (e.g., FIG. 2B) or low/poor within-wafer uniformity (e.g., FIGS. 2C and 2D). It is noted, however, that even for the high within-wafer uniformity example of FIG. 2B, grown at about 500 degrees Celsius, the epitaxial layer 209 may have a non-negligible amount of defects smaller than a certain size (e.g., smaller than about 100 nanometers). Thus, at least some existing epitaxial growth processes may not be well-suited for the fabrication of advanced semiconductor devices and circuits.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures directed to a high-yield and high-productivity (e.g., high-throughput) epitaxial layer growth process, providing uniform epitaxial layers with a very low defect count, even for defects smaller than 100 nanometers in size. At least some embodiments are also directed to silicon epitaxial layer growth, where such epitaxial silicon layers may be used for semiconductor device fabrication (e.g., such as the transistor 100, the FinFET device 150, or other type of transistor or semiconductor device). To be sure, in some embodiments, other types of epitaxial layers such as III-V semiconductor layers, may also be grown using the methods described herein. As referred to above, scaled IC devices and circuits require higher-quality crystalline epitaxial layers (e.g., higher quality silicon epitaxial layers) with fewer defects, to provide higher yield. However, at least some existing processes have not been shown to achieve the high-level of quality (e.g., low number of defects coupled with high uniformity) required for advanced semiconductor devices.

As discussed in more detail below, embodiments discussed herein provide an epitaxial growth process including a two-step defect reduction bake, followed by a high-temperature epitaxial layer growth process, and the structures formed thereby. By way of example and in some embodiments, the two-step defect reduction bake includes a high-pressure bake (e.g., greater than about 500 Pa) and a lower-pressure bake (e.g., less than about 100 Pa). In some cases, the high-pressure bake may be performed at a temperature between about 700-850 degrees Celsius. In some embodiments, the high-pressure bake is performed for a duration equal to or greater than about 1 minute, in a hydrogen gas ($H_2$) ambient. In various examples, the lower-pressure bake may be performed at a temperature between about 700-850 degrees Celsius. In some embodiments, the lower-pressure bake is performed for a duration equal to or greater than about 1 minute, in a hydrogen gas ($H_2$) ambient. In some examples, the high-pressure bake is performed before the lower-pressure bake. Alternatively, in some cases, the lower-pressure bake is performed before the high-pressure bake. In various embodiments, and following the two-step defect reduction bake, a high-temperature epitaxial layer growth process is performed. By way of example, the high-temperature epitaxial layer growth process may be performed at a temperature between about 700-850 degrees Celsius and at a pressure from about 10 Pa to about 100 Pa. When the high-temperature epitaxial layer growth process is used to deposit silicon, the epitaxial layer growth process may use process gases including a Si-based gas, a Cl-based gas, and hydrogen gas ($H_2$). In some cases, helium gas may be used in place of hydrogen gas. In some embodiments, the two-step defect reduction bake and subsequent high-temperature epitaxial layer growth process are performed in-situ. As used herein, the term "in-situ" is used to describe processes that are performed while a device or substrate remains within a processing system (e.g., within the CVD reactor 200), and where for example, the processing system allows the substrate to remain under vacuum conditions. As such, the term "in-situ" may also generally be used to refer to processes in which the device or substrate being processed is not exposed to an external ambient (e.g., external to the processing system). To be sure, in some embodiments, a separate ex-situ two-step defect reduction bake followed by the subsequent high-temperature epitaxial layer growth process may provide some advantages as well (e.g., reduction of epitaxial layer defects). In addition, embodiments of the present disclosure may be equally applied to the fabrication of both N-type and P-type transistors.

In contrast to at least some epitaxial layer growth processes (e.g., Si epitaxial layer growth processes) which are used for mass-production, which employ low temperatures (e.g., less than 600 degrees Celsius), embodiments of the present disclosure provides methods for growing epitaxial layers at high-temperatures, while also providing low defects/particles, excellent within-wafer and wafer-to-wafer thickness uniformity, as needed for advanced semiconductor device fabrication. Such uniformity also increases production yield and, together with the reduced epitaxial layer defects/particles, improves device performance. In some embodiments, embodiments of the present disclosure reduce a number of defects by about 1000×, for example, as compared to at least some existing low temperature (e.g., 500-600 degrees Celsius) epitaxial layer growth methods (e.g., as compared to a baseline process).

Figure 3:
FIG. 3 is a flow chart of a method of performing a two-step defect reduction bake, followed by a high-temperature epitaxial layer growth process, in accordance with some embodiments.

Referring now to FIG. 3, illustrated is a method 300 of performing a two-step defect reduction bake, followed by a high-temperature epitaxial layer growth process, in accordance with some embodiments. The method 300 may be implemented on a single-gate planar device, such as the exemplary transistor 100 described above with reference to FIG. 1A, as well as on a multi-gate device, such as the FinFET device 150 described above with reference to FIG. 1B. Thus, one or more aspects discussed above with reference to the transistor 100 and/or the FinFET 150 may also apply to the method 300. To be sure, in various embodiments, the method 300 may be implemented on other devices such as gate-all-around (GAA) devices, Omega-gate (Ω-gate) devices, or Pi-gate (Π-gate) devices, as well as strained-semiconductor devices, silicon-on-insulator (SOI) devices, partially-depleted SOI devices, fully-depleted SOI devices, or other devices as known in the art.

It is understood that parts of the method 300 and/or any of the exemplary transistor devices discussed with reference to the method 300 may be fabricated by a well-known complementary metal-oxide-semiconductor (CMOS) technology process flow, and thus some processes are only briefly described herein. Further, it is understood that any exemplary transistor devices discussed herein may include various other devices and features, such as additional transistors, bipolar junction transistors, resistors, capacitors, diodes, fuses, etc., but are simplified for a better understanding of the inventive concepts of the present disclosure. Further, in some embodiments, the exemplary transistor device(s) disclosed herein may include a plurality of semiconductor devices (e.g., transistors), which may be interconnected. In addition, in some embodiments, various aspects of the present disclosure may be applicable to either one of a gate-last process or a gate-first process.

In addition, in some embodiments, the exemplary transistor devices illustrated herein may include a depiction of a device at an intermediate stage of processing, as may be fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof.

The method 300 begins at block 302 where one or more wafers are loaded into a reactor process chamber (e.g., such as the processing chamber 210 of the CVD reactor 200). In some embodiments, after loading the wafers in to the reactor process chamber, a hydrogen gas purge of the reactor process chamber may be performed. Thereafter, in some cases, a system processing temperature (e.g., of the CVD reactor) may be ramped up to a desired processing temperature, as described below. In some examples, a hydrogen chloride (HCl) vapor phase etching process may be performed to clean a surface of the wafers.

The method 300 proceeds to block 304 where a first pre-epitaxial layer deposition baking process is performed. In some embodiments, the first pre-epitaxial layer deposition baking process includes the high-pressure bake, as described above. Thus, the first pre-epitaxial layer deposition baking process may include baking the wafers, which are in the reactor process chamber, at a pressure greater than about 500 Pa, at a temperature between about 700-850 degrees Celsius, for a duration equal to or greater than about 1 minute, and in a hydrogen gas ($H_2$) ambient. In at least some examples, the duration of the first pre-epitaxial layer deposition baking process (e.g., the high-pressure bake) may be about 1 hour.

The method 300 proceeds to block 306 where a second pre-epitaxial layer deposition baking process is performed. In some embodiments, the second pre-epitaxial layer deposition baking process includes the lower-pressure bake, as described above. Thus, the second pre-epitaxial layer deposition baking process may include baking the wafers, which remain in the reactor process chamber after the first baking process, at a pressure less than about 100 Pa, at a temperature between about 700-850 degrees Celsius, for a duration equal to or greater than about 1 minute, and in a hydrogen gas ($H_2$) ambient. In at least some examples, the duration of the second pre-epitaxial layer deposition baking process (e.g., the lower-pressure bake) may be about 1 hour.

While the first pre-epitaxial layer deposition baking process of block 304 has been described above as including the high-pressure bake, it will be understood that in some embodiments the first pre-epitaxial layer deposition baking process of block 304 may alternatively include the lower-pressure bake. Similarly, while the second pre-epitaxial layer deposition baking process of block 306 has been described above as including the lower-pressure bake, it will be understood that in some embodiments the second pre-epitaxial layer deposition baking process of block 306 may alternatively include the high-pressure bake. Thus, in some examples, the high-pressure bake may be performed before the lower-pressure bake. Alternatively, in some cases, the lower-pressure bake may be performed before the high-pressure bake.

As described above, at least one aspect of the present disclosure is directed toward the reduction of defects and/or particles within and/or on a surface of an epitaxially-grown layer. In the various embodiments described herein, this goal is achieved in part by the two-step defect reduction bake describe above, and illustrated in blocks 304 and 306. By way of example, benefits of the two-step defect reduction bake process, as well as a potential mechanism by which the two-step defect reduction bake achieves the desired low number of defects and/or particles, is described in more detail with reference to FIGS. 4A, 4B, 4C, FIGS. 5A, 5B, 5C, and FIG. 6.

Figure 4C:
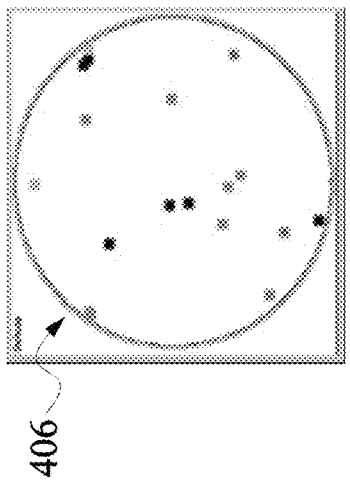
FIGS. 4A, 4B, and 4C illustrate a number and type of defects present on wafers processed according to each of a first, second, and third processing condition, respectively, and in accordance with some embodiments.
Figure 4B:
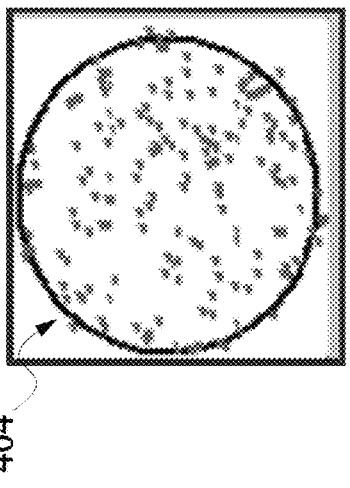
Figure 4A:
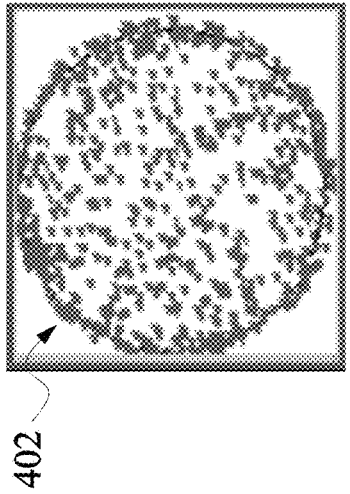

Referring first to FIGS. 4A, 4B, and 4C, illustrated therein are exemplary implementations of pre-epitaxial layer deposition baking process denoted as "Process A", "Process B", and "Process C", respectively. In particular, each of the FIGS. 4A-4C illustrate a number and type of defects present on wafers processed according to each of the Processes A, B, C. For example, Process A of FIG. 4A represents a single-step high-pressure bake, performed at a pressure of about 1,000 Pa, at a temperature of about 800° C., for a duration of about 2 hours. FIG. 4A also illustrates a particle defect map 402, showing a large defect density for a wafer processed using Process A. In particular, the data for a wafer processed using Process A shows a very large number of defects (791), including 700 concave-type defects, 76 hump-type defects, and 15 fall-on-type defects. As a reference, FIGS. 5A, 5B, and 5C illustrate examples of a concave-type defect 502, a hump-type defect 504, and a fall-on-type defect 506, respectively. Process B of FIG. 4B represents a two-step baking process, where first a lower-pressure bake is performed at a pressure of about 20 Pa, at a temperature of about 800° C., for a duration of about 1 hour, followed by a high-pressure bake at a pressure of about 1,000 Pa, at a temperature of about 800° C., for a duration of about 1 hour. FIG. 4B also illustrates a particle defect map 404, showing a defect density for a wafer processed using Process B, which is smaller than the defect density shown in the particle defect map 402. In particular, the data for a wafer processed using Process B shows a smaller number of defects (178) as compared to Process A (791), where the defects for Process B include 142 concave-type defects, 21 hump-type defects, and 15 fall-on-type defects. Process C of FIG. 4C also represents a two-step baking process, but in this example first a high-pressure bake is performed at a pressure of about 1,000 Pa, at a temperature of about 800° C., for a duration of about 1 hour, followed by a lower-pressure bake at a pressure of about 20 Pa, at a temperature of about 800° C., for a duration of about 1 hour. FIG. 4C illustrates a particle defect map 406, showing a defect density for a wafer processed using Process C, which is smaller than the defect density shown in both of the particle defect maps 402 and 404. In particular, the data for a wafer processed using Process C shows the smallest number of defects (18) as compared to Process B (178) and Process A (791), where the defects for Process C include 6 concave-type defects, 2 hump-type defects, and 10 fall-on-type defects. In some embodiments, the examples of FIGS. 4A-4C represent defects on un-patterned wafers, for example, having blanket epitaxial layers. It is also noted that, in various embodiments, each of the baking steps of each of the Processes A, B, and C may additionally be performed in a hydrogen gas ($H_2$) ambient, as described above. In sum, considering Processes A, B, C of FIGS. 4A, 4B, and 4C, respectively, it is evident that the two-step baking processes (Processes B and C) are superior to the single-step baking process (Process A), showing enhanced defect reduction. Moreover, in at least some examples, such as that illustrated in FIGS. 4A-4C, the high-pressure first/lower-pressure second two-step bake process of Process C shows the best defect reduction among the compared baking processes.

Figure 6:
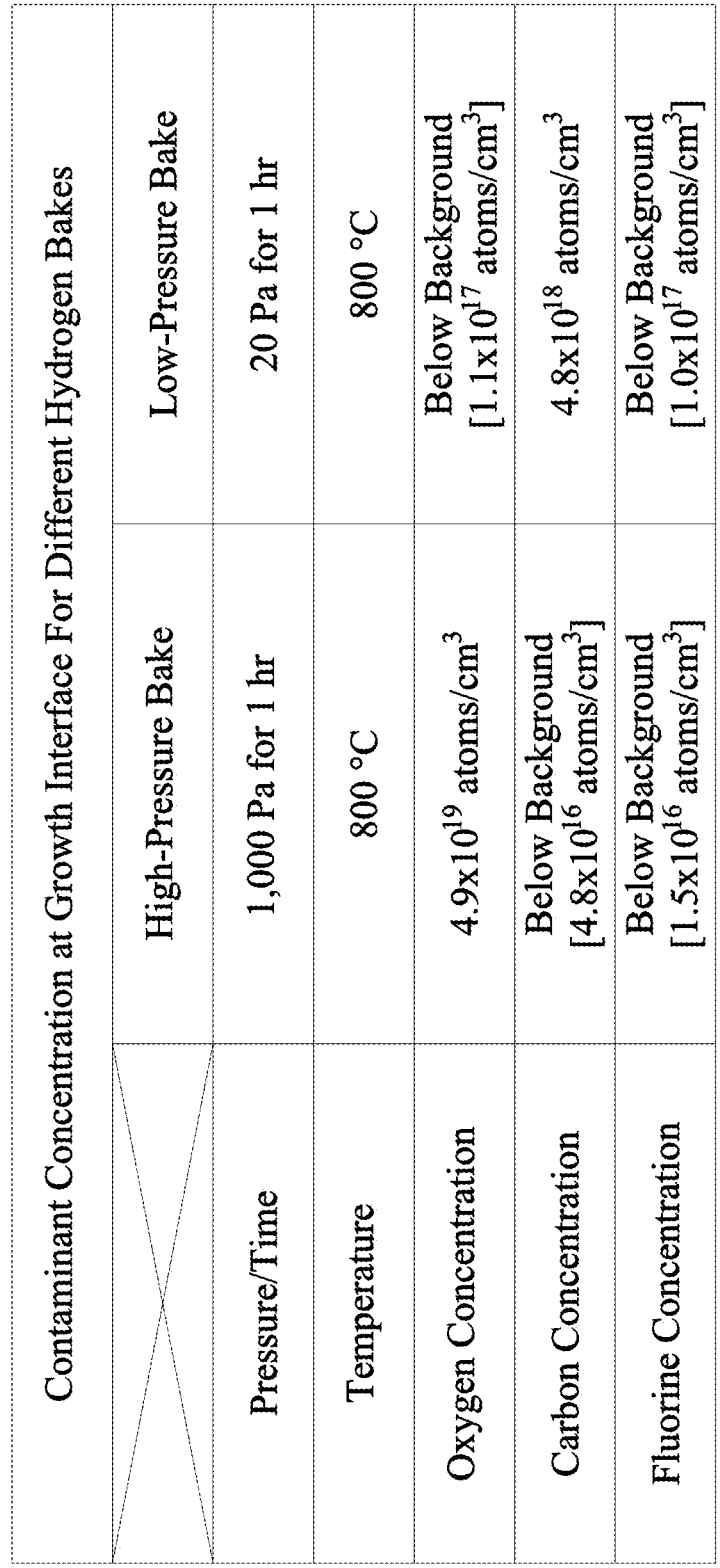
FIG. 6 provides a table showing a concentration (atoms/$cm^3$) of contaminants at a growth interface, illustrating an effect of the two-step defect reduction bake, in accordance with some embodiments.

Referring now to FIG. 6, illustrated is a table 600 which helps to explain a potential mechanism (e.g., physical mechanism) by which the two-step defect reduction bake achieves a low number of defects and/or particles, in accordance with the embodiments described herein. As shown, the table 600 provides a concentration (atoms/cm$^3$) of contaminants, including oxygen, carbon, and fluorine, at a growth interface (e.g., such as the growth interface 217 shown in FIG. 2B) for different hydrogen bakes (e.g., in a hydrogen gas ($H_2$) ambient, as described above). In various embodiments, reduction of the contaminant concentration at the growth interface may additionally reduce the contaminant concentration throughout the epitaxially grown layer. In some cases, the data of the table 600 may be collected by using a secondary ion mass spectrometry (SIMS) measurement technique. In particular, the high-pressure bake and low-pressure bake data of the table 600 represents first and second bakes of a two-step defect reduction bake process, respectively, such as the two-step baking processes (Processes B and C) of FIGS. 4B/4C. By way of example, the high-pressure bake data of FIG. 6 represents a baking step (e.g., of a two-step baking process) where a high-pressure bake is performed at a pressure of about 1,000 Pa, at a temperature of about 800° C., and for a duration of about 1 hour. Moreover, the high-pressure bake data of the table 600 shows that a concentration of carbon atoms is effectively reduced (e.g., carbon is removed) as a result of the high-pressure bake. Similarly, the low-pressure bake data of FIG. 6 represents a baking step (e.g., of a two-step baking process) where a lower-pressure bake is performed at a pressure of about 20 Pa, at a temperature of about 800° C., and for a duration of about 1 hour. Moreover, the low-pressure bake data of the table 600 shows that a concentration of oxygen atoms is effectively reduced (e.g., oxygen is removed) as a result of the lower-pressure bake. Thus, considering the high-pressure bake and low-pressure bake data of FIG. 6 together, it is evident that a combination of a high-pressure bake and a lower-pressure bake may be used to effectively reduce and/or remove both carbon and oxygen from an epitaxially-grown layer. Stated another way, embodiments of the present disclosure provide a two-step baking process, where a first step of the two-step baking process removes a first contaminant (e.g., carbon), and where a second step of the two-step baking process removes a second contaminant (e.g., oxygen). It is also noted that a concentration of fluorine atoms is low, below a background concentration level, for both the high-pressure bake and low-pressure bake. While specific examples of baking conditions (e.g., pressure, temperature, time) have been given for each of the first and second steps of the two-step baking process, and while specific examples of contaminants (e.g., carbon, oxygen) which may be removed by the two-step baking process have been given, it will be understood that other processing conditions for each of the first and second steps of the two-step baking process may be used to remove any of a plurality of other contaminants (e.g., hydrocarbons, water vapor, or other contaminants as known in the art), without departing from the scope of the present disclosure.

Returning to the method 300 and following the two-step defect reduction bake of blocks 304 and 306, the method 300 proceeds to block 308 where an epitaxial layer is deposited (e.g., on a semiconductor wafer). In some embodiments, after the baking process of block 306, the system processing temperature (e.g., of the CVD reactor) may be changed to a desired epitaxial growth temperature. In some cases, the growth temperature may be higher or lower than the temperature used for the baking process of block 306, thus the system processing temperature may be ramped up or down, according to a particular processing condition. In some embodiments, the growth temperature may be substantially the same as the temperature used for the baking process of block 306, thus the system processing temperature may remain unchanged between the baking process of block 306 and the subsequent growth of block 308. By way of example, the epitaxial layer deposition of block 308 may include a high-temperature epitaxial layer growth process that is performed at a temperature between about 700-850 degrees Celsius and at a pressure from about 10 Pa to about 100 Pa. This is in contrast to at least some existing epitaxial layer growth processes that are performed at temperatures from 500-600 degrees Celsius. In various embodiments, for example when epitaxial layer growth process of block 308 is used to deposit silicon, process gases (e.g., precursors) which are introduced into the processing chamber (e.g., the processing chamber 210) may include a Si-based gas, a Cl-based gas, and hydrogen gas ($H_2$). For example, in some cases, the gases flowed into the processing chamber to perform the epitaxial layer deposition of block 308 may include silane ($SiH_4$), hydrogen chloride (HCl), and hydrogen gas ($H_2$). To be sure, any of a plurality of other precursor gases may be used in various embodiments, both to grow different types of epitaxial layer (e.g., germanium, SiGe, etc.) and/or to dope epitaxial layers (e.g., N-type or P-type). For examples, in some embodiments, the precursor gases used to perform the epitaxial layer deposition of block 308 may alternatively or additionally include one or more of disilane ($Si_2H_6$), dichlorosilane ($H_2SiCl_2$), germane ($GeH_4$), methylsilane ($SiH_3CH_3$), silicon tetrachloride ($SiCl_4$), germanium tetrafluoride ($GeF_4$), silicon tetrafluoride ($SiF_4$), trichlorosilane ($HSiCl_3$), diborane ($B_2H_6$), phosphine ($PH_3$), arsine ($AsH_3$), boron trifluoride ($BF_3$), boron-11 trifluoride ($^{11}BF_3$), and trimethylborane ($B(CH_3)_3$). At the end of the growth process of block 308, flow of the precursor gases may be turned off. In various embodiments, a duration of the epitaxial layer growth process of block 308 may be selected based on a desired layer thickness. Additionally, in some embodiments, the two-step defect reduction bake of blocks 304, 306 and subsequent epitaxial layer growth process of block 308 may be performed in-situ.

The method 300 then proceeds to block 310 where the one or more wafers are unloaded from the reactor process chamber (e.g., such as the processing chamber 210 of the CVD reactor 200). In some embodiments, after the growth process of block 308 and prior to the unloading step of block 310, a hydrogen gas purge of the reactor process chamber may be performed, the system processing temperature may be reduced (e.g., to a room temperature), and a nitrogen gas purge of the reactor process chamber may be performed.

Figure 7C:
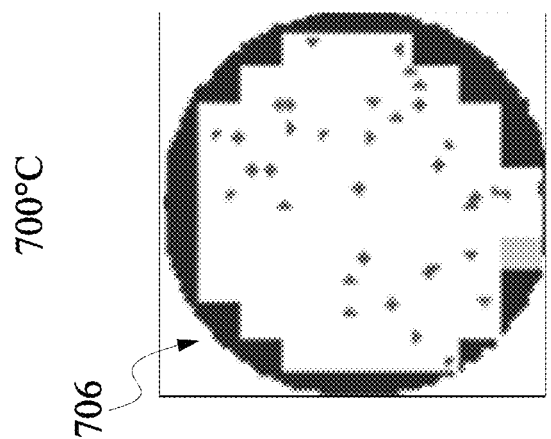
FIGS. 7A, 7B, and 7C illustrate a number of defects present on patterned wafers processed according to each of a first, second, and third processing condition, respectively, and in accordance with some embodiments.
Figure 7B:
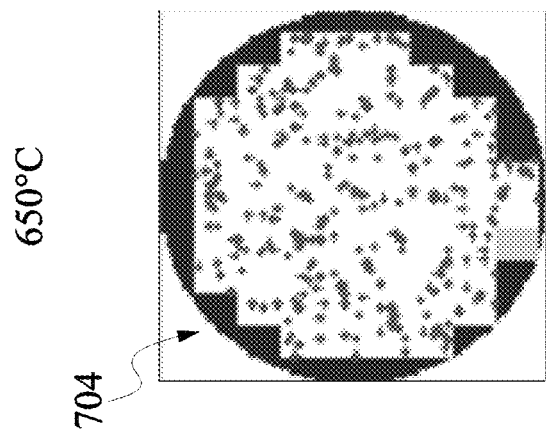
Figure 7A:
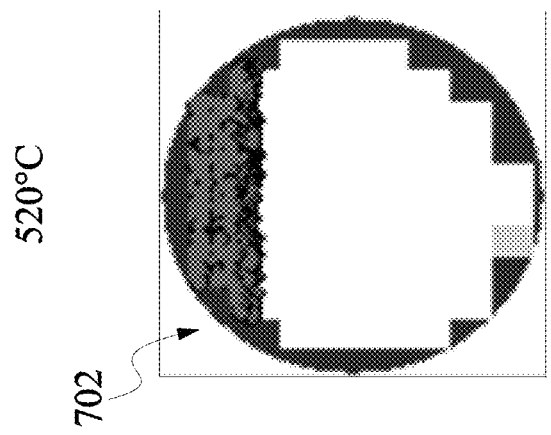

As discussed above, the epitaxial layer deposition of block 308 may be performed at a temperature between about 700-850 degrees Celsius (e.g., as compared to at least some existing epitaxial layer growth processes performed from 500-600° C.). Embodiments of the present disclosure provide for epitaxial growth at higher-temperatures, which may be effectively done to maintain and/or provide a very low defect count within and/or on the epitaxially-grown layer. With reference to FIGS. 7A, 7B, and 7C, illustrated therein are exemplary implementations of the epitaxial growth process of block 308, where the growth is performed at different temperatures. In particular, each of the FIGS. 7A, 7B, and 7C provide particle defect maps 702, 704, and 706, respectively, illustrating defect densities for wafers where an epitaxial layer (e.g., epitaxial Si layer) is grown at 520° C. (FIG. 7A), 650° C. (FIG. 7B), and 700° C. (FIG. 7C). FIGS. 7A-7C further provide data showing that for an epitaxial layer grown at 520° C. (FIG. 7A), a patterned wafer defect count is greater than about 100,000 (>100,000 ea); for an epitaxial layer grown at 650° C. (FIG. 7B), a patterned wafer defect count is about 466 (466 ea); and for an epitaxial layer grown at 700° C. (FIG. 7C), a patterned wafer defect count is about 69 (69 ea). In some embodiments, the examples of FIGS. 7A-7C represent defects on patterned wafers. In some cases, the patterned wafer defect counts may be measured using a laser scanning patterned wafer defect inspector, such as a PUMA laser scanning patterned wafer defect inspection system manufactured by KLA-Tencor Corporation, of Milpitas, Cal. Thus, for increasing epitaxial layer growth temperature, the number of epitaxial layer defects is reduced. However, it is noted that while higher epitaxial growth temperature may result in enhanced defect reduction, further increases in the epitaxial growth temperature (e.g., greater than about 800 C) may result in undesirable dopant diffusion of dopants either in underlying layers and/or within the presently grown epitaxial layer itself, as described in more detail below.

Figure 8:
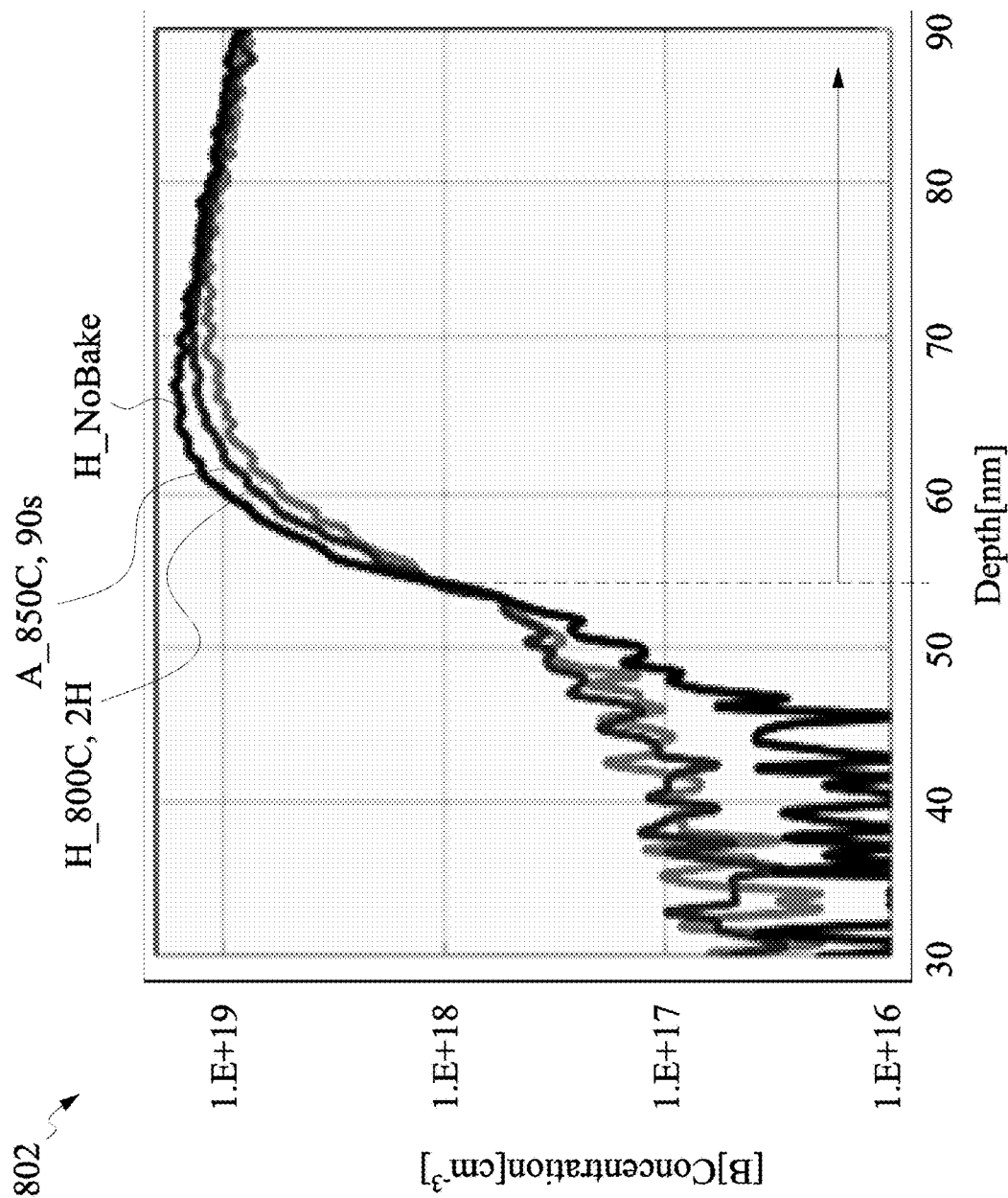
FIG. 8 illustrates a graph showing boron concentration (per $cm^3$) as a function of depth (in nanometers), for a variety of temperatures, and in accordance with some embodiments.

Referring to FIG. 8, illustrated therein is a graph 802 showing boron concentration (per $cm^3$) as a function of depth (in nanometers), for a variety of temperatures and baking times. The data of FIG. 8 shows that the highest boron diffusion may occur at temperatures greater than 800° C., which could lead to diminished device performance for epitaxial layers processed at such temperatures. Thus, as discussed above, while higher temperatures may provide for enhanced defect reduction, excessively high temperatures (e.g., >800° C.) may cause undesirable dopant diffusion (e.g., B diffusion). As a result, in at least some embodiments, the epitaxial layer deposition of block 308 may be performed at a temperature between about 700-800 degrees Celsius. For example, when there are dopants present in underlying layers, or when the grown epitaxial layer is being doped during growth, it may be desirable to perform the epitaxial layer deposition of block 308 from about 700-800 degrees Celsius.

Figures 9A, 9B:
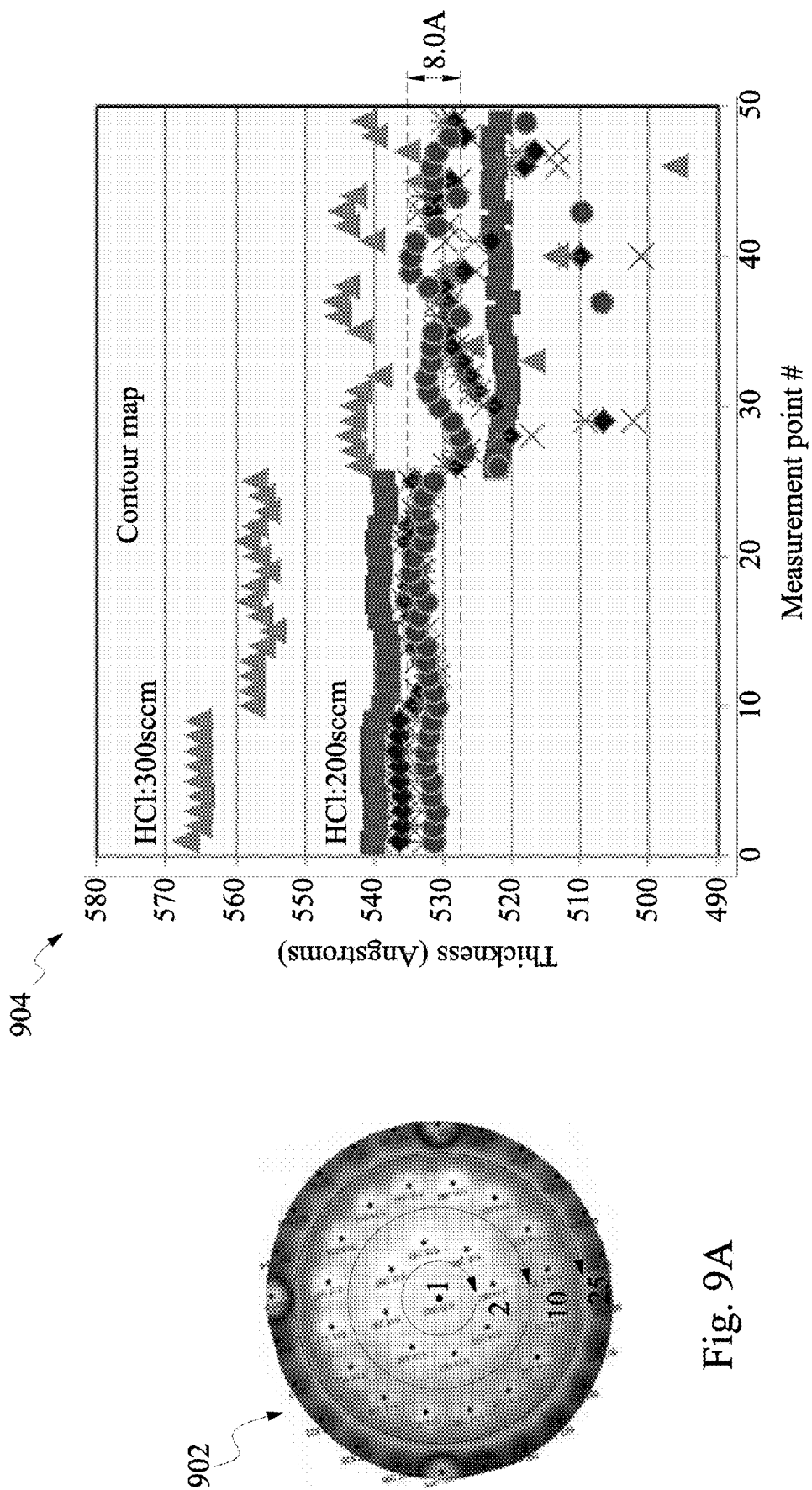
FIG. 9A illustrates a contour map of a semiconductor wafer having an epitaxial layer deposited thereupon, in accordance with some aspects of the present disclosure.
FIG. 9B illustrates a graph showing an epitaxial layer thickness as a function of measurement point number, corresponding to the contour map of FIG. 9A.

As also discussed above, in some embodiments, the epitaxial layer deposition of block 308 may include silane ($SiH_4$), hydrogen chloride (HCl), and hydrogen gas ($H_2$). In particular, aspects of the present disclosure further provide for tuning of a wafer thickness (e.g., tuning of a thickness of a deposited epitaxial layer) by controlling a flow of the HCl gas. With reference to FIG. 9A, illustrated therein is a contour map 902 of a semiconductor wafer having an epitaxial layer deposited thereupon, in accordance with some aspects of the present disclosure. The contour map 902 provides a mapping of an epitaxial layer thickness (e.g., shown in Angstroms, for each point measured across a wafer) for at least one set of processing conditions. As shown, a numbering scheme for points measured across the wafer is also provided in the contour map 902. Referring to FIG. 9B, illustrated therein is a graph 904 showing an epitaxial layer thickness (e.g., in Angstroms) as a function of measurement point number (#), where the measurement point number (#) corresponds to the numbering scheme provided in the contour map 902. In particular, FIG. 9B provides a visualization of the thickness uniformity of a grown epitaxial layer for a variety of processing conditions, including for a variety of temperatures and HCl gas flow rates. For example, square symbols (□) represent epitaxial layer growth performed at 700° C. with an HCl gas flow rate of 200 standard cubic centimeters per minute (sccm); triangular symbols (▲) represent epitaxial layer growth performed at 700° C. with an HCl gas flow rate of 300 sccm; 'X' symbols represent epitaxial layer growth performed at 710° C. with an HCl gas flow rate of 200 sccm; diamond symbols (+) represent epitaxial layer growth performed at 720° C. with an HCl gas flow rate of 200 sccm; modified 'X' symbols (e.g., having a vertical line therethrough) represent epitaxial layer growth performed at 730° C. with an HCl gas flow rate of 200 sccm; and circular symbols (●) represent epitaxial layer growth performed at 740° C. with an HCl gas flow rate of 200 sccm. In some aspects, the data of the graph 904 shows that a higher HCl gas flow rate (e.g., 300 sccm) results in a decrease in epitaxial layer thickness near the wafer edge (and an overall greater center-to-edge variation in thickness), and an increase in epitaxial layer growth temperature results in a tighter center-to-edge thickness distribution, showing an improvement (e.g., an increase) in the epitaxial layer thickness near the wafer edge. In particular, in at least some embodiments and as also shown by FIG. 9B, appropriate tuning of the HCl flow rate and epitaxial layer growth temperature can provide a center-to-edge epitaxial layer thickness variation of around 8 Angstroms. It will be understood however, that the data presented is merely exemplary, and further tuning of processing parameters (e.g., growth temperature, pressure, time, gas flow rates) may provide an even better center-to-edge epitaxial layer thickness variation (e.g., less than 8 Angstroms).

The various embodiments disclosed herein may be utilized, for example, for the growth of any of a variety of epitaxial layers formed during the course of semiconductor wafer processing and/or semiconductor device fabrication. For examples, in some cases embodiments, aspects of the present disclosure may be used to grown epitaxial blanket layers (e.g., as part of the substrate 102), epitaxial source/drain regions (e.g., of the transistor 100 or the FinFET device 150), epitaxial FinFET fin layers, epitaxial layers for bipolar devices, CMOS devices, and memory devices (e.g., DRAM), epitaxial transistor channel layers, as well as for selective epitaxial growth applications, and/or any of a plurality of other epitaxial layer applications as known in the art. In general, and merely for purposes of illustration, consider that aspects of the present disclosure are used to form one or more epitaxially-grown layers of the transistor 100 and/or the FinFET device 150. In such examples, the devices (e.g., the transistor 100 and/or the FinFET device 150) fabricated in according to the method 300 may undergo further processing to form various features and regions known in the art. For example, subsequent processing may form various contacts/vias/lines and multilayers interconnect features (e.g., metal layers and interlayer dielectrics) on the substrate including the device (e.g., the transistor 100 and/or the FinFET device 150), configured to connect the various features to form a functional circuit that may include one or more devices (e.g., one or more transistors 100 and/or FinFETs 150). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 300, and some process steps described above may be replaced or eliminated in accordance with various embodiments of the method 300.

Referring now to FIG. 10, illustrated therein is a schematic diagram of a multi-wafer UHV/CVD system 1000 including a horizontal reactor and where the system 1000, like the CVD reactor 200 discussed above, may also be used to implement one or more of the embodiments disclosed herein. Wafers 1002 may be arranged on a wafer boat, where the wafer boat may be positioned in a quartz tube which is heated by a multi-zone furnace. In some embodiments, gases (e.g., precursor gases) may be introduced at one end of the furnace and pumped from the other end using UHV-capable throughput pumps (e.g., including a turbopump or a compound turbopump). In various embodiments, a load lock may be used so that low partial pressures of important contaminants such as hydrocarbons, water vapor, and oxygen can be properly maintained.

In general, embodiments of the present disclosure (or at least certain aspects of the present disclosure) may be applied to any of a plurality of different types of systems such as single-wafer systems, single-wafer UHV/CVD systems, batch wafer systems, cold-wall systems, hot-wall systems, systems using resistance heating, radio frequency (RF) induction heating, lamp heating, laser heating, photo-assisted CVD systems, barrel reactors, pancake reactors, cellular reactors, rapid thermal process (RTP) reactors, tube reactors, showerhead reactors, low-pressure CVD reactors, metalorganic CVD reactors, photon-enhanced CVD reactors, plasma-enhanced CVD reactors, atmospheric pressure CVD reactors, molecular beam CVD reactors, and/or other types systems as known in the art.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods and structures directed to a high-yield and high-productivity (e.g., high-throughput) epitaxial layer growth process, providing uniform epitaxial layers with a very low defect count, even for defects smaller than 100 nanometers in size. Various embodiments discussed herein provide an epitaxial growth process including a two-step defect reduction bake, which effectively reduces an amount of defects, followed by a high-temperature epitaxial layer growth process, which further reduces defects and where process parameters (e.g., HCl flow rate and growth temperature) may be tuned to provide superior epitaxial layer thickness uniformity.

Thus, one of the embodiments of the present disclosure described a method for fabricating a semiconductor device, where the method includes loading a semiconductor wafer into a processing chamber. In various examples, while the semiconductor wafer is loaded within the processing chamber, a first pre-epitaxial layer deposition baking process is performed at a first pressure and first temperature. In some cases, after the first pre-epitaxial layer deposition baking process, a second pre-epitaxial layer deposition baking process is then performed at a second pressure and second temperature. In some embodiments, the second pressure is different than the first pressure. By way of example, after the second pre-epitaxial layer deposition baking process and while at a growth temperature, a precursor gas may then be introduced into the processing chamber to deposit an epitaxial layer over the semiconductor wafer.

In another of the embodiments, discussed is a method where prior to deposition of an epitaxial layer, a two-step baking process of a semiconductor wafer is performed (e.g., while the semiconductor wafer is housed within a processing chamber). In some embodiments, after performing the two-step baking process, the epitaxial layer may then be deposited over the semiconductor wafer. In various examples, the two-step baking process described includes a first baking step performed at a first pressure and a second baking step performed at a second pressure different than the first pressure. Additionally, in some cases, the first baking step removes a first contaminant and the second baking step removes a second contaminant.

In yet another of the embodiments, discussed is a method that includes loading a semiconductor wafer into a processing chamber, performing a first purge of the processing chamber, and ramping a processing chamber temperature up to a first baking temperature. In various examples, after the first purge, a first baking process is performed (e.g., in a hydrogen gas ambient) at a first baking pressure and at the first baking temperature. In some cases, the first baking process removes carbon contamination. Subsequent to the first baking process, and in some embodiments, a second baking process is performed (e.g., in the hydrogen gas ambient) at a second baking pressure and at a second baking temperature, where the second baking pressure is less than the first baking pressure. In some examples, the second baking process removes oxygen contamination. In various embodiments, after the second baking process, an epitaxial layer is deposited over the semiconductor wafer by flowing silane ($SiH_4$) and hydrogen chloride (HCl) gas over the semiconductor wafer at a growth pressure and at a growth temperature. By way of example, following the deposition of the epitaxial layer, a second purge of the processing chamber may be performed and the processing chamber temperature may be ramped down to room temperature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
baking, at a first temperature, a semiconductor wafer including a multi-gate device at an intermediate stage of processing;

baking, at a second temperature, the semiconductor wafer including the multi-gate device at the intermediate stage of processing; and after baking the semiconductor wafer at the first and second temperatures, growing, at a growth temperature consistently greater than the first and second temperatures, an epitaxial layer over the multi-gate device.

2. The method of claim 1, wherein the epitaxial layer includes a silicon epitaxial layer.

3. The method of claim 1, wherein the baking at the first temperature is performed at a first pressure, and wherein the baking at the second temperature is performed at a second pressure less than the first pressure.

4. The method of claim 1, wherein the first temperature, the second temperature, and the growth temperature are each between about 700 C and about 800 C.

5. The method of claim 1, further comprising baking the semiconductor wafer at each of the first and second temperatures for a duration greater than about 1 minute.

6. The method of claim 1, further comprising baking the semiconductor wafer at each of the first and second temperatures in a hydrogen gas ($H_2$) ambient.

7. The method of claim 1, wherein the epitaxial layer is grown at a growth pressure from about 10 Pa to about 100 Pa.

8. The method of claim 1, wherein the growing the epitaxial layer is performed using a precursor gas that includes a combination of a Si-based gas, a Cl-based gas, and a hydrogen gas ($H_2$).

9. The method of claim 8, wherein the Si-based gas includes silane ($SiH_4$), and wherein the Cl-based gas includes hydrogen chloride (HCl) gas.

10. The method of claim 1, wherein the epitaxial layer includes a source/drain region of the multi-gate device.

11. The method of claim 1, wherein the multi-gate device includes a FinFET device, and wherein the epitaxial layer includes a fin layer of the FinFET device.

12. The method of claim 1, wherein the epitaxial layer includes a channel layer of the multi-gate device.

13. A method, comprising:

performing a multi-step baking process of a semiconductor substrate; and after the performing the multi-step baking process, growing an epitaxial layer over the semiconductor substrate;

wherein a first step of the multi-step baking process includes baking the semiconductor substrate at a first pressure, wherein a second step of the multi-step baking process includes baking the semiconductor substrate at a second pressure different than the first pressure, wherein one of the first and second steps removes oxygen contamination, wherein the other of the first and second steps removes carbon contamination, and wherein the growing the epitaxial layer is performed at a higher temperature than the first and second steps of the multi-step baking process.

14. The method of claim 13, wherein the first pressure is about 1000 Pa, and wherein the second pressure is about 20 Pa.

15. The method of claim 13, wherein the epitaxial layer includes a source/drain region of a multi-gate device or a channel layer of the multi-gate device.

16. The method of claim 13, wherein each of the first and second steps of the multi-step baking process is performed for a duration of about 1 hour.

17. The method of claim 13, wherein each of the first and second steps of the multi-step baking process is performed at a temperature of about 800 C.

18. A method, comprising:

while maintaining a processing chamber under vacuum and at a first temperature, performing a first baking process to remove carbon contamination from a semiconductor wafer and reduce a defect count for each of a plurality of defect types;

while maintaining the processing chamber under vacuum and at a second temperature, performing a second baking process to remove oxygen contamination from the semiconductor wafer and further reduce the defect count for each of the plurality of defect types; and after the first and second baking processes and while maintaining the processing chamber under vacuum, growing an epitaxial layer over the semiconductor wafer at a growth temperature greater than the first and second temperatures.

19. The method of claim 18, wherein the first baking process is performed at a first baking pressure, and wherein the second baking process is performed at a second baking pressure less than the first baking pressure.

20. The method of claim 18, wherein at least some of the plurality of defect types include concave-type defects, hump-type defects, and fall-on-type defects.

* * * * *